United States Patent [19]

Nerem

[11] 4,095,127
[45] June 13, 1978

[54] TRANSISTOR BASE DRIVE REGULATOR
[75] Inventor: Arne Nerem, San Diego, Calif.
[73] Assignee: Rohr Industries, Incorporated, Chula Vista, Calif.
[21] Appl. No.: 671,094
[22] Filed: Mar. 29, 1976
[51] Int. Cl.² ........................................... H03K 17/60
[52] U.S. Cl. ................................... 307/253; 307/300
[58] Field of Search ............... 307/300, 253, 254, 255, 307/270

[56] References Cited

U.S. PATENT DOCUMENTS

| | | | |
|---|---|---|---|
| 2,887,542 | 5/1959 | Blair et al. | 307/254 |
| 3,566,158 | 2/1971 | Paine | 307/300 |

*Primary Examiner*—John Zazworsky
*Assistant Examiner*—Marcus S. Rasco
*Attorney, Agent, or Firm*—Patrick J. Schlesinger; Frank D. Gilliam

[57] ABSTRACT

A base drive regulator for a transistor operation in a switching mode comprising a series transistor regulator between the source of drive voltage and the base of the switching transistor and a diode with its anode element connected to the base of the series transistor regulator and its cathode connected to the collector of the switching transistor. The material used for construction of the switching transistor, series regulator transistor and the diode has similar electrical characteristics.

5 Claims, 4 Drawing Figures

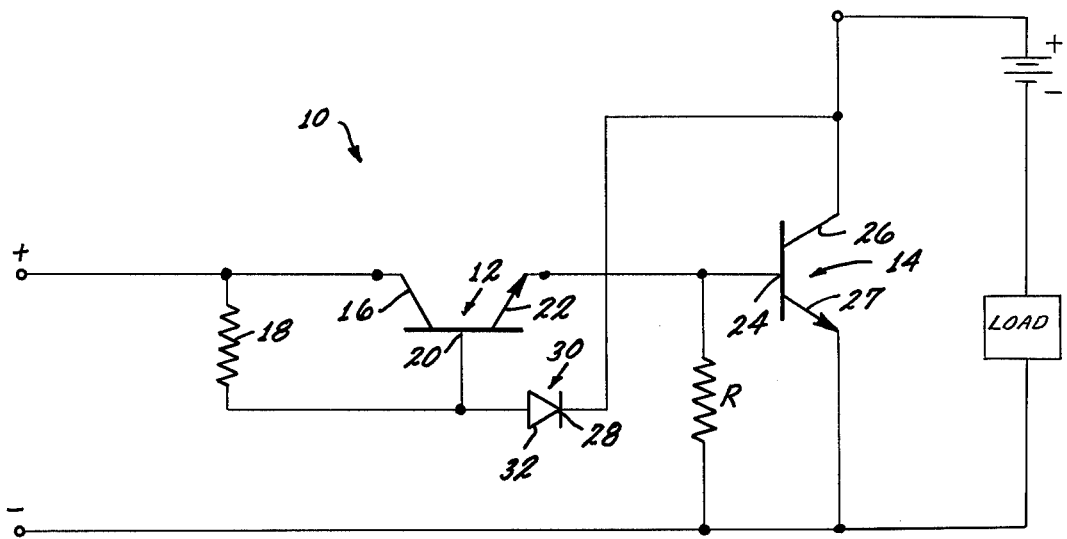
Fig.1
Fig.2
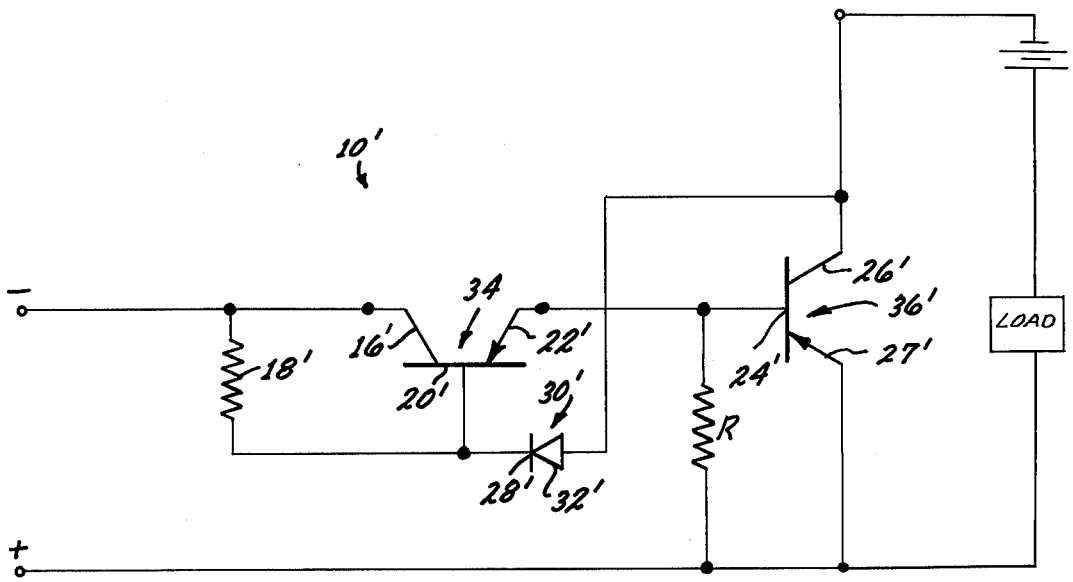

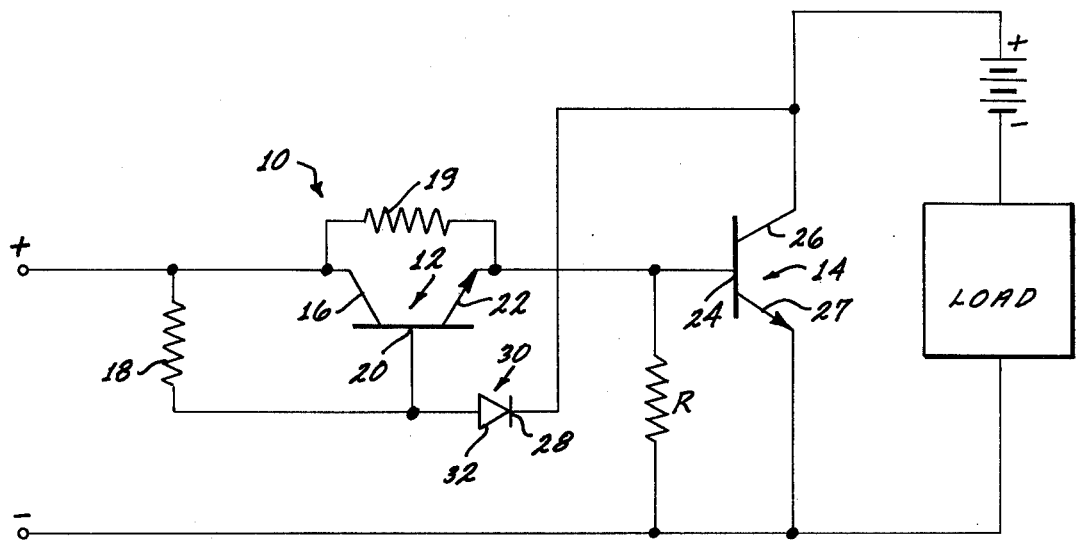
Fig. 3
Fig. 4
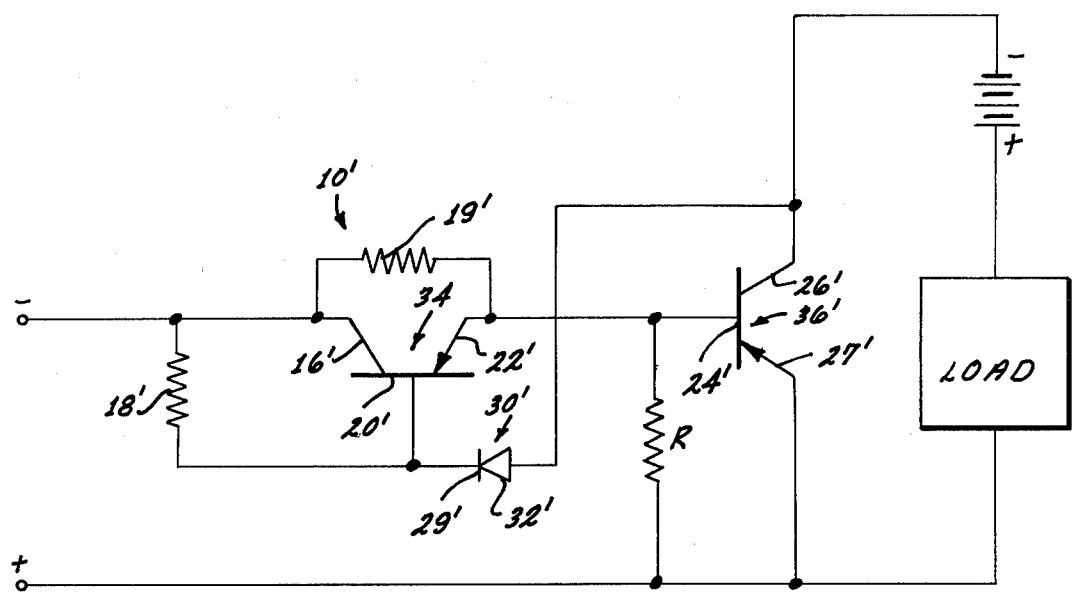

TRANSISTOR BASE DRIVE REGULATOR

BACKGROUND OF THE INVENTION

The invention relates to the regulation of a switching transistor and more particularly to preventing the switching transistor from going into saturation while in the on or conductive state.

The most popular method of regulating conduction of switching transistors is the clamp diode method. This method utilizes a diode between the base and collector elements of the switching transistor. This method has found success even though an excess amount of base drive power is wasted by shunting excess base drive power through the transistor.

Another circuit for regulating base drive is disclosed in NASA report No. NASA TN 0-6511 dated December, 1971. This method is similar to the instant invention except a plurality of series diodes are employed between the emitter of the drive regulator and the base of the output transistor. This scheme provides a minimum of 2.1 volts on the collector of the output transistor which is three times greater than that level required for 0 collector to base voltage. This results in three times the conduction dissipation of the output transistor and is therefore undesirable in terms of circuit efficiency.

Other methods of regulating base drive power employ complicated feed back control circuits requiring a substantial number of additional electrical components for their operation. This increases economic cost, weight and susceptibility to failure.

There would be immediate acceptance by industry of a means for regulating base drive to a switching transistor that was more efficient, comprised of a limited number of components and could be produced at a reduced economic cost over the prior art devices.

SUMMARY OF THE INVENTION

Accordingly, an object of the instant invention is to provide a new and improved circuit for controlling the base drive to a transistor operating in a switching mode.

Another object of the instant invention is to provide a system for maintaining the collector voltage level of a transistor operating in a switching mode from dropping to a level less than its base voltage level.

Still another object of the instant invention is to provide a feedback circuit wherein a transistor operating in a switching mode controls its own base drive voltage level.

Still a further object of the instant invention is to provide minimum conduction dissipation of an output transistor operating in a switching mode.

Briefly, these and other objects of the instant invention are attained by the use of a regulator transistor in series between the signal voltage and the base of a transistor operating in a switching mode and connecting the collector of the switching transistor to the base element of the regulator transistor through a diode enabling the switching transistor to limit its own conductivity.

The circuit is simple and inexpensive to construct and provides for effective base drive control of a transistor operating in a switching mode.

The above and other specific features of the instant invention will be readily apparent as the description continues while being read in conjunction with the appended drawings.

DESCRIPTION OF THE DRAWINGS

FIG. 1 is a schematic of the circuit of the instant invention as applied to an NPN type transistor.

FIG. 2 is a schematic of the circuit of the instant invention as applied to a PNP type transistor.

FIG. 3 is a schematic showing of a second embodiment of the invention shown in FIG. 1.

FIG. 4 is a schematic showing of a second embodiment of the invention of FIG. 2.

DETAILED DESCRIPTION OF THE PREFERRED EMBODIMENT OF THE INVENTION

The same reference numerals are used throughout the drawings to depict the same element or part.

Referring now to FIG. 1, the circuit 10 of the instant invention is shown utilizing a series regulator transistor 12 and switching transistor 14 of the NPN type.

The positive going signal voltage used for controlling the switching of transistor 14 is applied to the collector element 16 and through a resistor 18 to the base 20 of transistor 12. The value of the resistor 18 is determined by the manufacturer's requirements, i.e., for an MJE 200 transistor manufactured by Motorola, a resistor is used that divides the signal voltage input level to a voltage of a ratio of approximately 10 to 1 on the collector and base elements so as to provide normal operation of the transistor 12. Other type transistors and those made by other manufacturers require various different operating voltage ratios. The emitter element 22 of transistor 12 is connected to the base element 24 of transistor 14. The collector element 26 of transistor 14 is connected to the cathode element 28 of a diode 30. The anode element 32 of the same diode 30 is connected to the base element of transistor 12. The collector element 26 of transistor 14 is connected to a source of collector voltage and the emitter 27 is connected to ground or to a point common with the negative potential of the input signal and collector voltages.

Under certain operating conditions, namely, when the base drive is at a low level, it is desirable to reduce the gain of transistor 12, a resistor 19 is connected between the collector 16, and emitter 22. The value of the resistor is determined by the transistor 12. Generally the resistor will supply a voltage to the base of transistor 14 of approximately 0.1 volt below the voltage between the base 20 and emitter 22 of transistor 12.

The regulator transistor 12, the diode 30 and the switching transistor 14 are constructed of material having the same or similar electrical characteristics so that when current flows through diode 30, the voltage level at the base 20 of transistor 12 is substantially equal to twice the voltage at the base of the switching transistor 14 so that the voltage on the collector element 26 of the switching transistor 14 is at least equal to or greater than its base drive voltage level.

The embodiment shown utilizes an MJE 200 as transistor 12, an MR 818 as diode 30 and a BU 108 as transistor 14. The devices of the preferred embodiment are constructed of silicon type material. It should be noted that although the transistor and diode of the preferred embodiment utilize silicon any known semi-conductor material could be employed so long as the characteristics of the material provide the voltage levels on the collector and base of the switching transistor as hereinbefore specified.

FIG. 2 is a showing of the instant invention employing a PNP type transistors 34, 36. The only difference being that the input signal is negative going, the collector voltage for transistor 36 is at a high negative potential and the emitter 27 is connected to a high positive potential.

The resistance value of resistor R, shown in the Figs., is determined from the manufacturers's operating specifications. Typically, the resistive value of resistor R is determined by transistor requirements and circuit characteristics and is generally known in the art.

OPERATION OF THE PREFERRED EMBODIMENT

The input signal is applied to the conductor 16, 16' of transistor 12, 34 and the base 20, 20' through resistor 18, 18' causing current to flow through resistor 18, 18' and into base 20, 20' of transistor 12, 34. At this instant transistor 12, 34 conducts between its collector 16, 16' and emitter 22, 22'. This conduction supplies a base voltage level to its respective transistor 14, 36 turning it on. When this base voltage is applied to transistor 14, 36, current flows between the collector element 26, 26' and the emitter element 27, 27' reducing the normally high voltage potential on the collector 26, 26' as conduction of the transistor increases. When the collector voltage reaches a level less than the voltage level at base 24, 24' of transistor 14, 36 the diode 30 conducts, its back bias voltage now being removed, as the voltage level of the collector 26, 26' of transistor 14, 36' drops below its base voltage level, dividing the current path between base emitter junction of transistor 12, 34 into two substantially equal resistive paths. The diode 30 and the transistors are constructed of material having the same or similar electrical characteristics. The current flow through two substantially equal resistive paths provides a voltage level substantially equal at the collector 26, and base elements 24, 24' of transistor 14, 36. The reduction of voltage at the base element 20, 20' of transistor 12, 34 reduces the base drive to transistor 14, 36, thus reducing the dissipation of drive power while maintaining the switching transistor in an on state. The maintaining of a voltage level on the collector element 26, 26' of switching transistor 14, 36 equal to or greater than the voltage level in its base element 24, 24' prevents the transistor 14, 36 from saturating thereby improving the transistor high speed switching capabilities by controlling the transistor saturation level.

The resistor 19 may be required where a low level of input voltage is supplied to the regulator transistor 12, 34 so as to maintain a level of voltage on the base 24, 24' of the output transistor 14, 36 at all times.

Many changes may be made in details of the instant invention, in the method and material of fabrication, in the configuration and assemblage of the constituent elements, without departing from the spirit and scope of the appended claims, which changes are intended to be embraced therewithin.

Having thus described the invention, what is claimed as new and useful and desired to be secured by United States Letters Patent is:

1. A base drive regulator for a first transistor having base, emitter and collector elements, which comprises,
    (a) a source of base drive voltage,
    (b) active single element regulator means for controlling said first transistor; said regulator means connected between said source and said base element of said first transistor,
    (c) said regulator means including an additional transistor having a base, emitter and collector and responsive to said source and directly connected to said base of first transistor for supplying drive voltage to said base of said first transistor and,
    (d) resistive bi-directional means connected between the emitter and collector of said additional transistor for maintaining a bias voltage on said base of said first transistor of a value above the normal voltage on said base of said first transistor when said additional transistor responsive to said source is non-conducting and a drive voltage is present, and
    (e) a diode connected between the base of said additional transistor and the collector element of the first transistor so as to maintain a substantially zero differential voltage between said collector element and said base element of said first transistor.

2. The invention as defined in claim 1, wherein said diode has an anode and a cathode, said anode connected to the base of said additional transistor and its cathode connected to the collector of said first transistor.

3. The invention as defined in claim 1, wherein said first transistor, additional transistor and diode are constructed from material having substantially the same electrical characteristics.

4. The invention as defined in claim 3, wherein said material is silicon.

5. The invention as defined in claim 1, wherein said resistive bi-directional means is a resistor.

* * * * *